United States Patent [19]
Tanizawa et al.

[11] Patent Number: 4,499,484
[45] Date of Patent: Feb. 12, 1985

[54] INTEGRATED CIRCUIT MANUFACTURED BY MASTER SLICE METHOD

[75] Inventors: Tetsu Tanizawa; Hitoshi Omichi, both of Kawasaki; Yoshiharu Mitono, Tokyo, all of Japan

[73] Assignee: Fujitsu Limited, Kawasaki, Japan

[21] Appl. No.: 415,795

[22] Filed: Sep. 8, 1982

[51] Int. Cl.³ .................... H01L 21/70; H01L 21/90; H01L 29/44
[52] U.S. Cl. ........................................ 357/68; 357/40; 357/45; 357/65
[58] Field of Search .................. 357/68, 65, 70, 71, 357/40, 45

[56] References Cited

U.S. PATENT DOCUMENTS

| Re. 26,803 | 2/1970 | Wolf | 357/36 X |
|---|---|---|---|
| 4,006,492 | 2/1977 | Eichelberger et al. | 357/68 X |
| 4,161,662 | 7/1979 | Malcolm et al. | 357/40 X |
| 4,249,193 | 2/1981 | Balyoz et al. | 357/68 X |
| 4,295,149 | 10/1981 | Bolyoz et al. | 357/68 X |

Primary Examiner—Andrew J. James
Assistant Examiner—Sheila V. Clark
Attorney, Agent, or Firm—Staas & Halsey

[57] ABSTRACT

In an integrated circuit manufactured by the master slice method, the feeder line for supplying electric power to a unit-cell array is gradually narrowed in width from the periphery to the middle of the array. As a result, sufficient voltage is supplied to the unit-cells at the middle of the IC and an area of an interconnecting domain for connecting the unit-cells is expanded.

6 Claims, 11 Drawing Figures

INTEGRATED CIRCUIT MANUFACTURED BY MASTER SLICE METHOD

BACKGROUND OF THE INVENTION

1. Field of the Invention

The present invention relates to an integrated circuit (IC) manufactured by the master slice method, more particularly to a gate array large scale integrated circuit (LSI) manufactured by the master slice method, wherein the desired LSI functions are realized by interconnecting previously prepared circuit elements in accordance with the request of users during the manufacture of the semiconductor.

2. Description of the Prior Art

In gate array LSI's manufactured by the master slice method, it is possible to produce many kinds of IC's of various desirable functions from a single kind of bulk just by changing the wiring layers. Below, a prior art LSI will be described with reference to FIGS. 1 to 3 in the BRIEF DESCRIPTION OF THE DRAWINGS.

Figure 1:
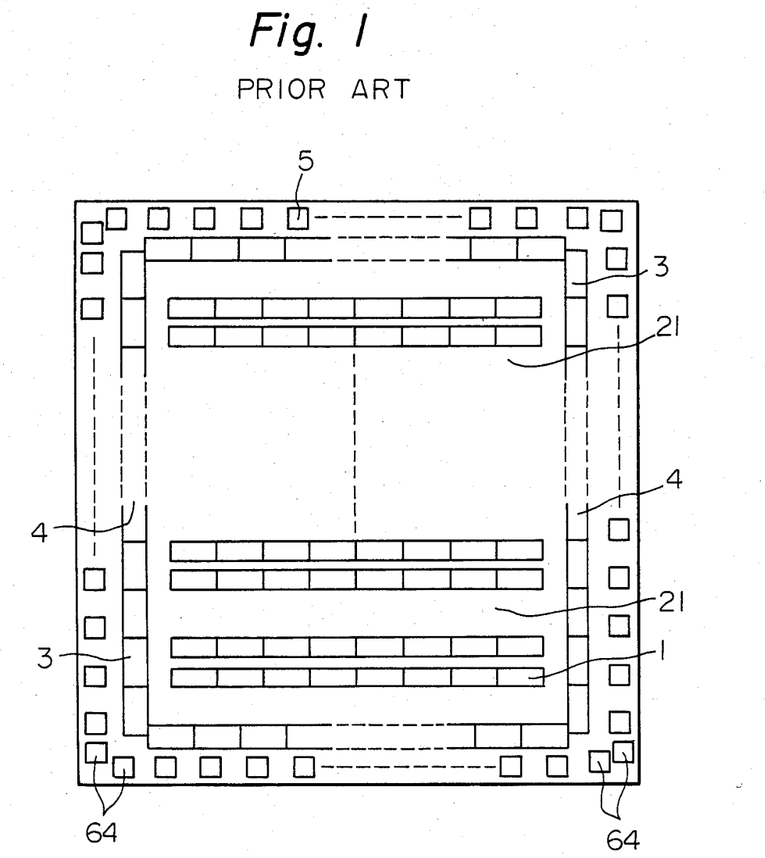
FIG. 1 is a schematic plan view of the layout of a prior art gate array LSI.
Figure 2:
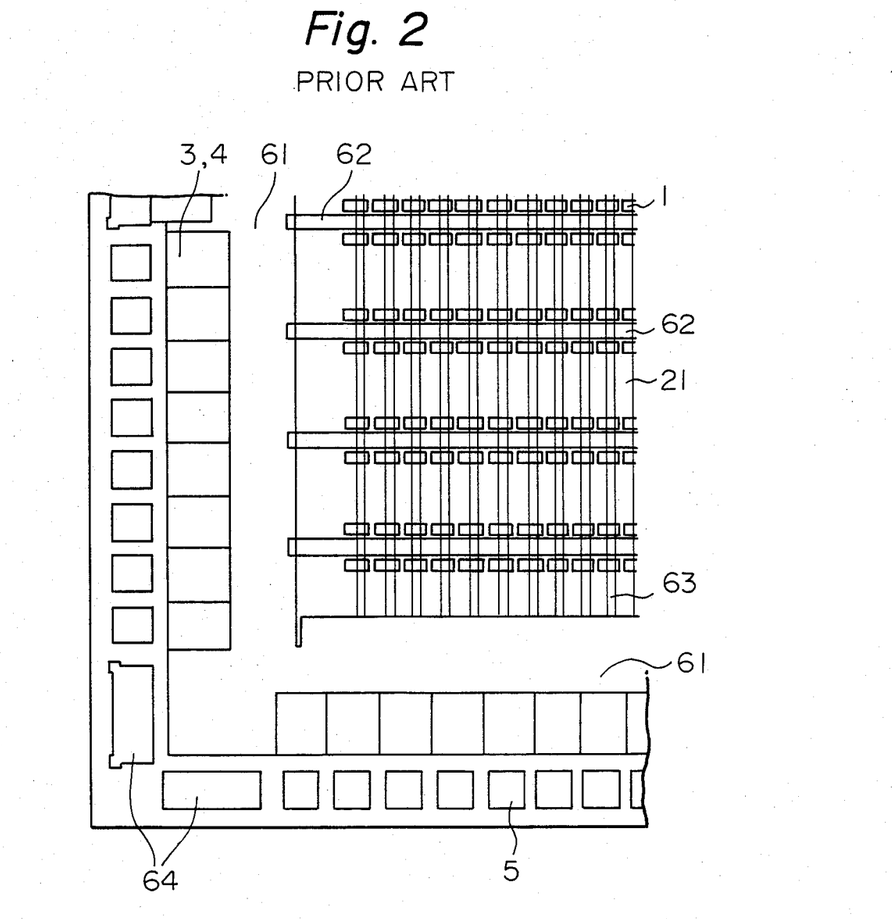
FIG. 2 is an enlarged plan view of the chip corner portion of the LSI in FIG. 1.
Figure 3:
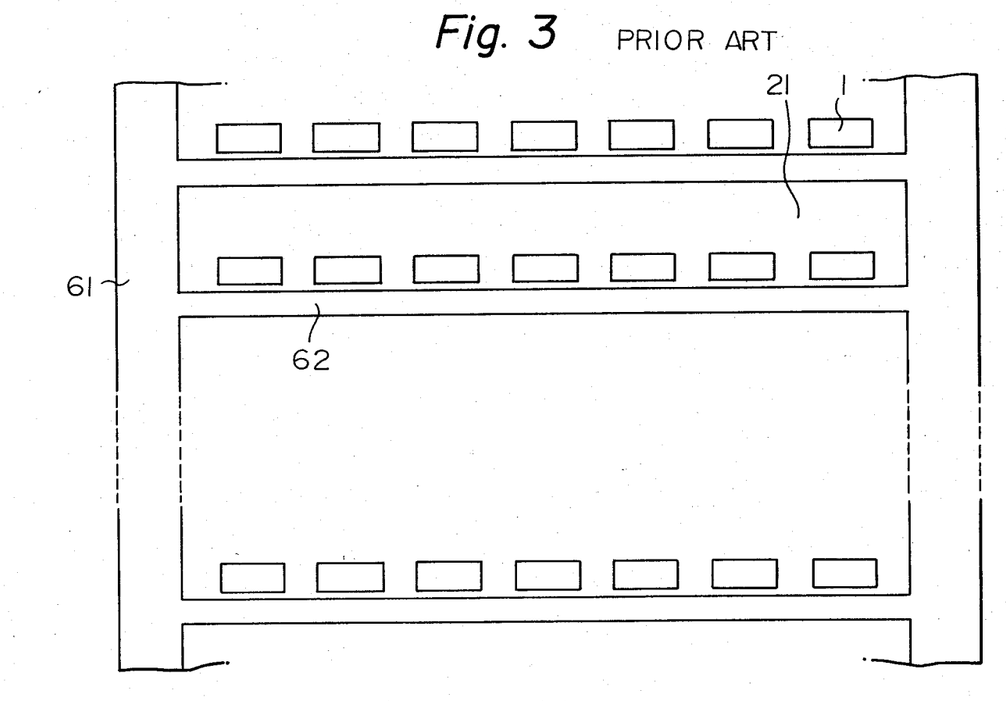
FIG. 3 is a partial plan view of the form of a feeder line in the LSI of FIG. 1.

FIG. 1 shows a schematic diagram of a prior art gate array LSI for explaining the layout thereof. FIG. 2 shows an enlarged view of the corner portion thereof. The above-mentioned gate array LSI usually comprises an array of unit-cells 1 having transistors, resistors, and other circuit elements and automatically interconnecting domains (channel domains) 21 for connecting the unit-cells 1. At the periphery of the unit-cell array, which comprises most of the logic circuits, input and output (I/O) cell domains 4 are arranged. I/O buffers 3 are located in the I/O cell domain 4 in order to electrically interface with external circuits. The unit-cells 1 are supplied with power through feeder lines 61, 62, and 63. The feeder line 61 is part of a multilayer print and is located at the periphery of the LSI. The feeder lines 62 and 63 branch out from the feeder line 61. In FIG. 1, illustration of the feeder line group, namely the feeder lines 61, 62, and 63, has been omitted to simplify the drawing. Reference numerals 5 and 64 indicate pads and pads for the power source, respectively. Bulks having the above-mentioned constitution are produced in advance in the gate array LSI. In response to the request of users, the interconnections are arranged by computer aided design (CAD) and the like. This allows many kinds of IC's to be supplied to users quickly by just changing the wiring layers.

The recent trend toward greater integration in the above-mentioned gate array LSI's, however, has created a need for increasingly larger channel domain areas 21 and numbers of wiring channels. Two methods to increase the channel domain areas are to increase the LSI area itself and to reduce the size of the element patterns in the chip. However, both methods result in high IC costs. Another method which is easier, is to leave the chip size as it is, but to uniformly reduce the width of the constant width feeder lines (62 and 61 in FIG. 3), thereby increasing the area of the channel domain 21 next to the feeder lines. However, this method also increases the resistance of the feeder lines 62 and 61, thereby increasing the voltage drop at the middle of the feeder lines 62 and 61 and preventing the supply of sufficient electric power to the unit-cells located at the middle portion of the LSI.

SUMMARY OF THE INVENTION

The object of the present invention is to provide an IC in which the channel domain area is enlarged and sufficient voltage to drive the unit-cells is assured at the middle portions of each of the feeder lines 62 and 61.

According to a fundamental feature of the present invention, there is provided an IC manufactured by the master slice method. The IC has an array of unit-cells and interconnecting domains for locating a wiring channel to interconnect the unit-cells. Desirable logic circuits are formed by changing interconnections inside the unit-cells and changing the interconnections between the unit-cells. The IC comprises feeder lines for supplying power to the unit-cells. The feeder lines extend from the periphery of the array toward the inside of the array. The feeder lines are substantially narrowed in width from the periphery to the middle of the array.

DESCRIPTION OF THE PREFERRED EMBODIMENTS

Figure 4:
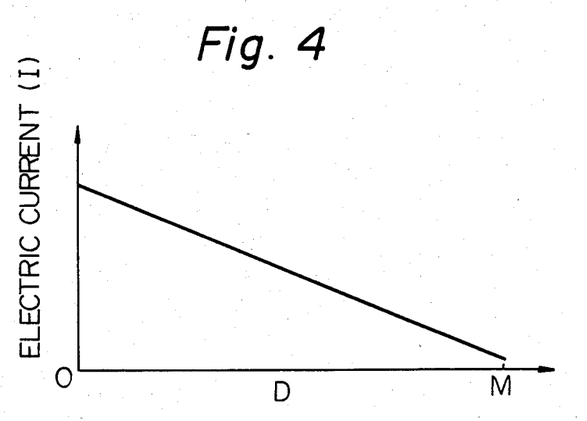
FIG. 4 is a graph of the distribution of the electric current in the feeder line of FIG. 3.

The principle of the present invention is explained with reference to the graph in FIG. 4. In FIG. 4, the distribution of the electric current along a constant-width feeder line is shown. In the figure, reference symbol I represents an electric current and reference symbol D represents the distance from the end (branching point) of the feeder line.

In a gate array LSI, unit-cells are arranged in regular rows and columns and power is supplied from the periphery. Therefore, the distribution of the electric current I on the feeder line is as shown in FIG. 4. Namely, the electric current I is great at the ends of the feeder line and gradually decreases toward the middle (M). In consideration of the above, the object of this invention is to change the width of the feeder line in response to the magnitude of the electric current passing through the concerned portion.

Figure 5:
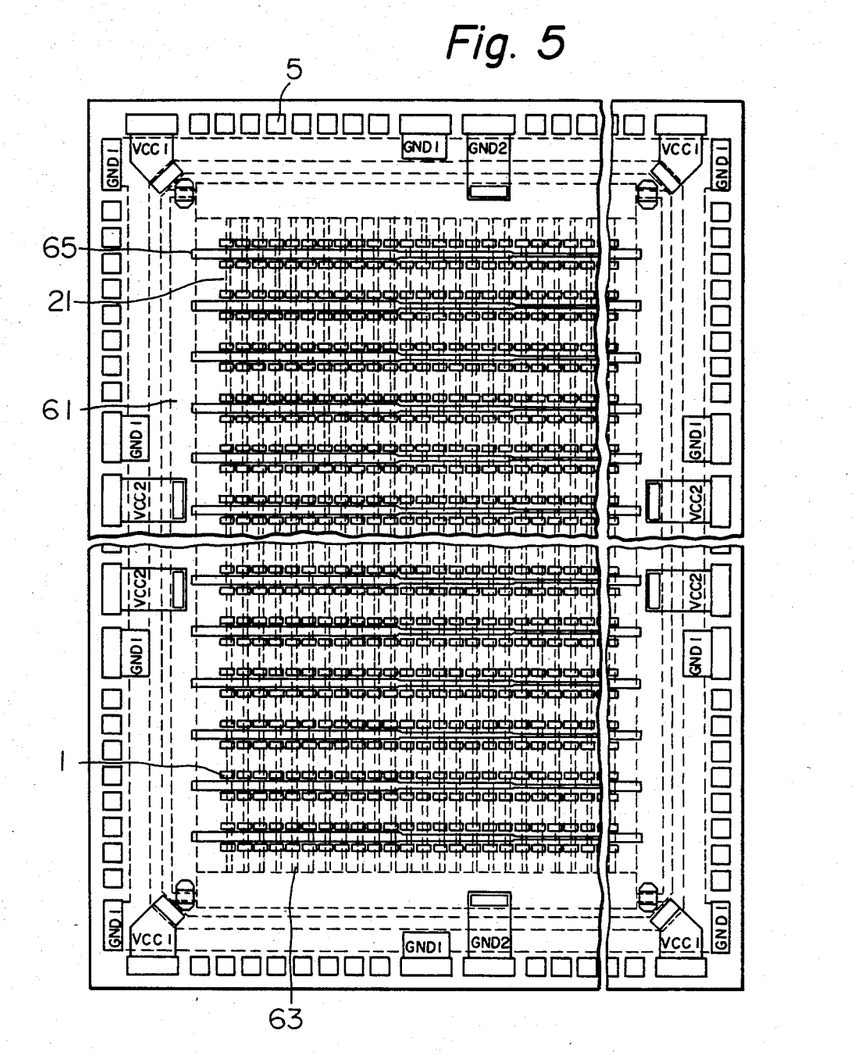
FIG. 5 is a schematic plan view of the layout of an IC manufactured by the master slice method according to a first embodiment of the present invention.

FIG. 5 is a plan view of the layout of an IC manufactured by the master slice method according to a first embodiment of the present invention. The figure shows unit-cells 1 and the pattern of the first layer for interconnection in solid lines and shows the pattern of the second layer for interconnection in broken lines. To simplify the drawing, illustration of the I/O buffers has been omitted. The I/O buffers are located at the periphery of the LSI.

Figure 6:
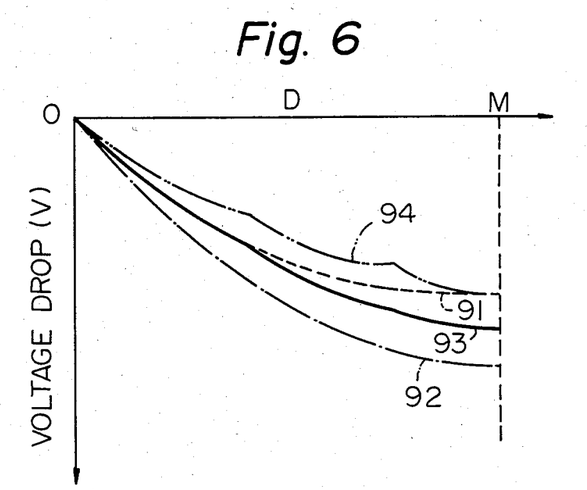
FIG. 6 is a graph comparing the voltage drop in the feeder lines in the LSI according to the present invention with the voltage drop in the prior art LSI.

FIG. 6 is a graph comparing characteristics of voltage drop on the feeder line in the IC of the invention with that of a conventional IC. The abscissa is same as that of the graph in FIG. 4. The ordinate shows the voltage drop V.

Figure 7:
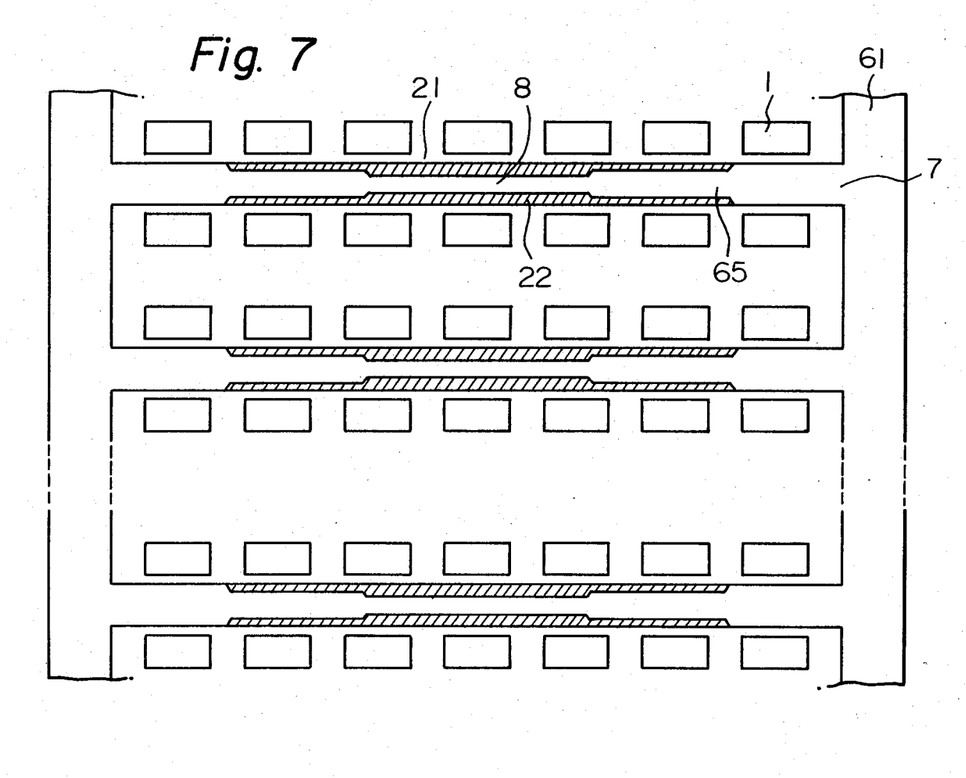
FIG. 7 is a partial enlarged view of the details of the feeder line of FIG. 5.

FIG. 7 is a partial enlarged view of the details of the feeder line of FIG. 5. In FIG. 7, however, the number of unit-cells in one row and column is less than that of FIG. 5. With reference to FIG. 7, the width of the feeder line 65 at the branched portion 7 is the same as with the conventional IC. The width at the middle 8, however, is decreased, so that the area of the channel domain 21 is increased. The hatched portions 22 in FIG. 7 show the increased area of the channel domain 21.

Uniform reduction of the width at all portions of the feeder line would result in the voltage drop on the feeder line shown by the curve 92 in FIG. 6, i.e., an increased voltage drop at all portions of the feeder line compared with the conventional type (curve 91). Formation of the feeder line as shown in FIG. 7, however, results in the voltage drop at the middle 8 becoming as shown by the curve 93, i.e., a voltage drop slightly greater than that of the curve 91 and more advantageous than that of the curve 92. This is made possible by the fact, as mentioned above, that the electric current I is smaller at the middle 8 of the IC chip. Therefore the decreased width of the feeder line and resultant increased resistance do not increase the voltage drop too much. In other words, the channel domain area can be increased by an amount corresponding to the decrease of the width of the feeder line at the middle 8 in the LSI, this decrease being equal to the amount of voltage required for the unit-cells near the middle 8 to be maintained.

Figure 8:
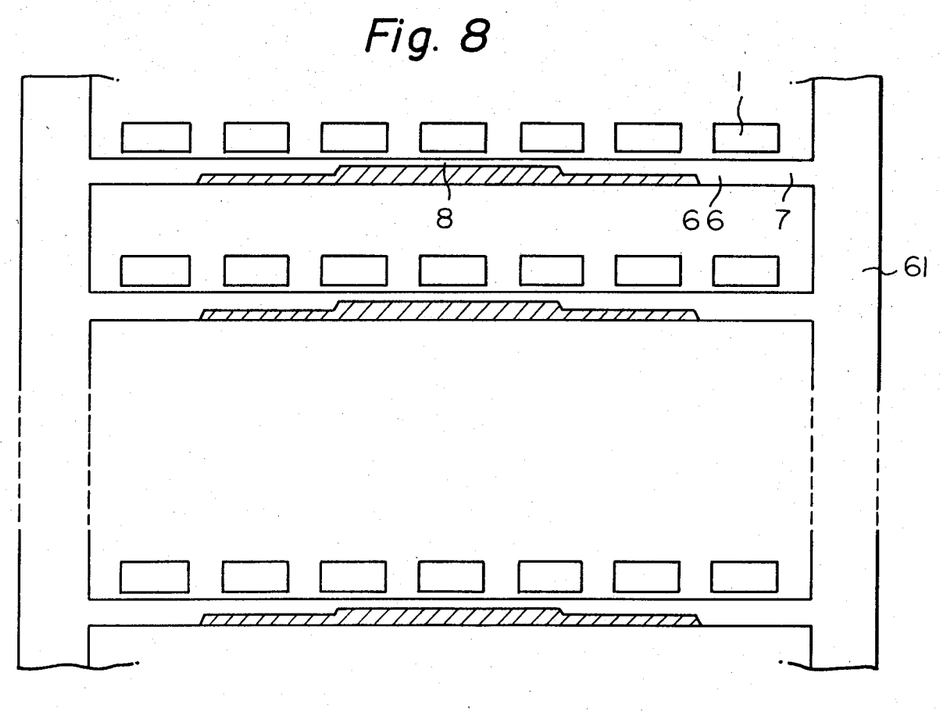
FIG. 8 is a partial enlarged view of a form of the feeder line according to a second embodiment of the present invention.

FIG. 8 shows a second embodiment of the present invention. In this embodiment, the reduction of the width of the middle of the feeder lines 66 is effected along only one side of the lines. The effect, however, is the same as the first embodiment. This formation of the feeder lines 66 allows the channel domain area to be increased at just the one side of the feeder lines 66. This is advantageous when the unit-cells 1 are arranged near the one side of the feeder lines.

Figure 9:
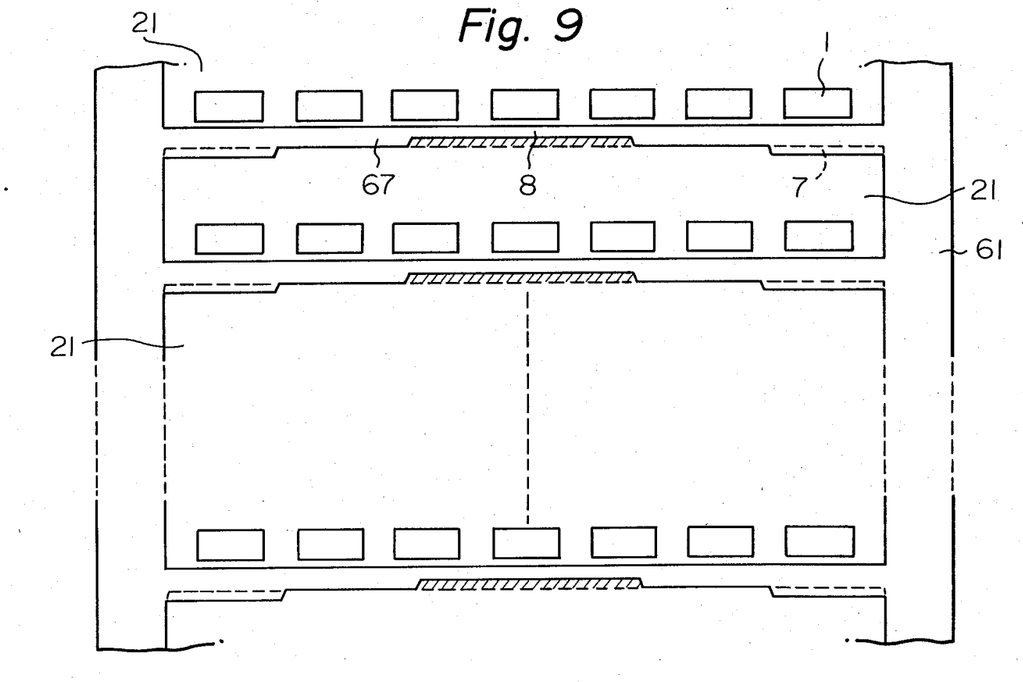
FIG. 9 is a partial enlarged view of a form of the feeder line according to a third embodiment of the present invention.

FIG. 9 shows a third embodiment of the present invention. In this embodiment, the feeder lines 67 are wider at the branched portions 7 than in conventional type feeder lines in addition to being narrower toward the middle 8 of the LSI. This increases the area of the channel domain 21 at the middle of the LSI, compared with the periphery, and decreases the voltage drop at all portions on the feeder line.

This form of the feeder lines does not allow as great an increase of the area of the channel domain 21 as in the second embodiment. However, in this case, the increase in the area of the channel domain 21 is at the middle instead of the periphery. This is preferable because the interconnections between unit-cells in the gate array LSI tend to be denser at the middle of the LSI. The increase of the area of the channel domain in the middle of the LSI is particularly advantageous when CAD is used for design of the interconnections. In addition, the relative width of the feeder line 67 at the branched portion 7 decreases the voltage drop on the feeder line 67 at the portion where the electric current is great compared with conventional IC's. Accordingly, the voltage drop at all portions of the feeder line 67 is decreased compared with corresponding portions in conventional IC's, as shown in the curves 94 and 91 (FIG. 6). This allows the unit-cells at the middle of the chip to be supplied with sufficient electric power.

Figure 10:
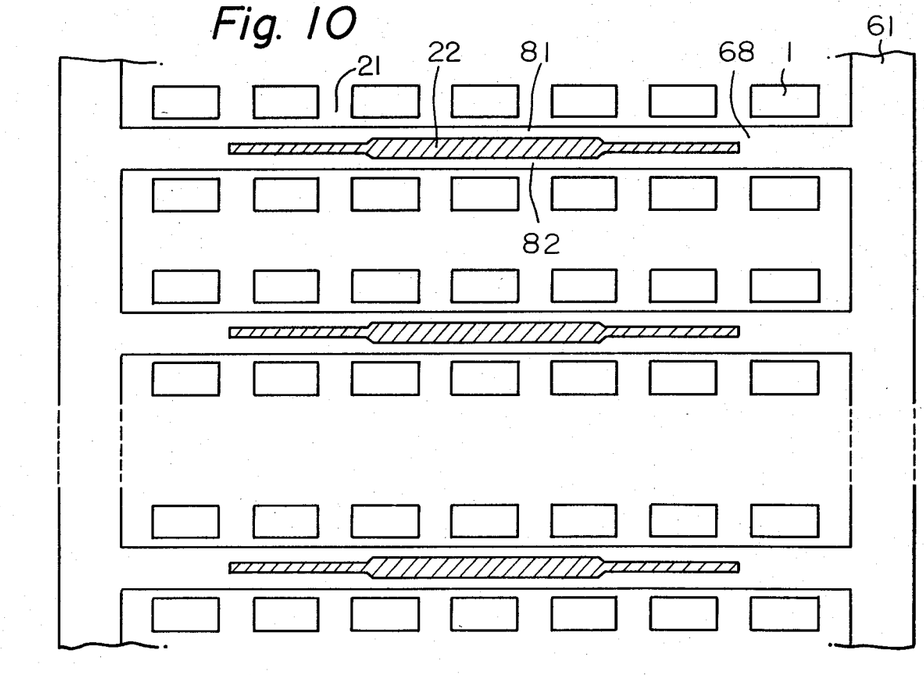
FIG. 10 is a partial enlarged view illustrating a form of the feeder line according to a fourth embodiment in the present invention.

FIG. 10 shows a fourth embodiment of the present invention. Like the first embodiment, this embodiment applies to the case where the unit-cells 1 are positioned near both sides of the feeder lines. In the first embodiment, the feeder line was decreased in width in stages from the outside in on both sides, as shown in FIG. 7. In this embodiment, a non-feeder portion 22 is provided in the feeder line, as shown in FIG. 10. The middle of the feeder line is thus constituted of two narrow feeder lines 81 and 82. In this way, the channel domain 21 is provided in the feeder line (hatched portion) for the increase of the area of the channel domain. The effect of the feeder line of FIG. 10, however, is similar to FIG. 7.

In the above-mentioned embodiments the width of the feeder lines was decreased with a stepped form. The width, however, may also be decreased continuously. Further, while the above-mentioned embodiments were described in reference to application to the feeder line 62 in FIG. 2, they may also be applied to the feeder line 63, which is a return line.

Figure 11:
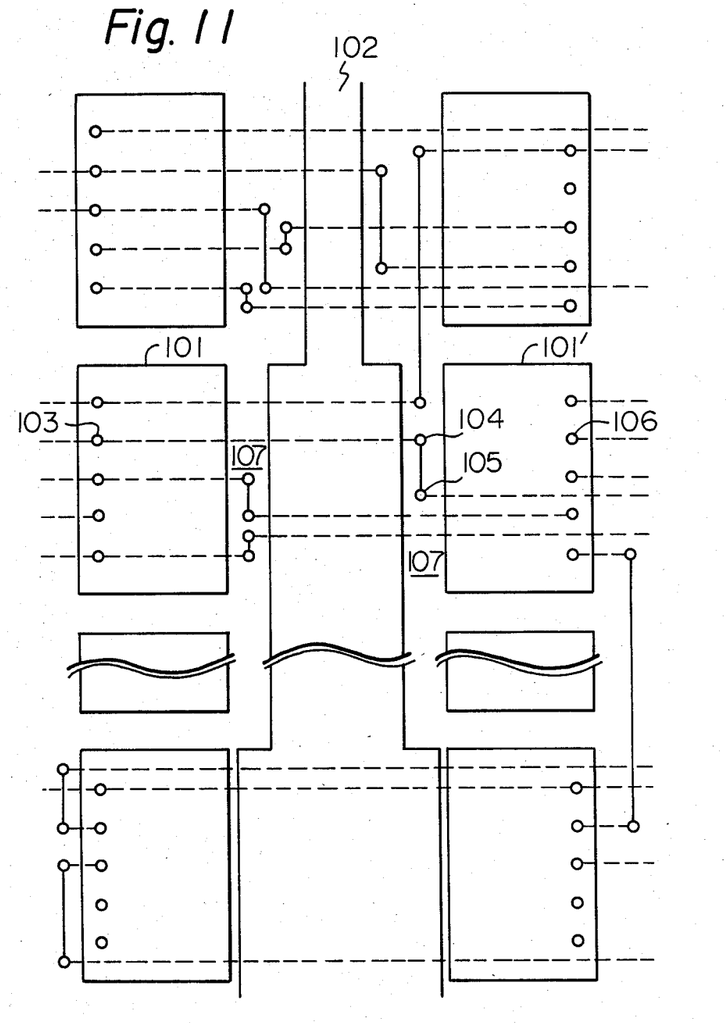
FIG. 11 is a partial enlarged plan view of an example of the wiring according to a fifth embodiment of the present invention.

FIG. 11 shows a fifth embodiment of the present invention. In the figure an example of the wiring at the periphery of a power feeder line 102 is shown. The solid line shows the wiring of the first layer, and the broken line shows the wiring of the second layer. The increased domains 107 which are produced by narrowing the width of the feeder line 102 in the array of the unit-cells is utilized as follows. For example, in the case of wiring from a port 103 to unit-cell 101', since a port 106 is already connected to another line, the wiring line from the port 103 must be wired avoiding the port 106. In this embodiment, in the above-mentioned case the wiring line in the second layer from the port 103 is connected to the first layer wiring line by a through-hole 104, and the first layer wiring line is connected to another second layer wiring line by a through-hole 105, utilizing the increased wiring domain 107. Thus, the wiring from the port 103 to unit-cell 101' is performed. As mentioned above, by utilizing the domain 107, various wirings can be laid and the flexibility of the wiring is improved.

By way of reference, it should be noted that the embodiment of FIG. 5 offers the following improvements besides those mentioned above.

1. The location of the pad (GND 1 and VCC 1 in FIG. 5) domain at a corner of the IC chip. The pad domain for the connection of the power source line is provided instead of the I/O buffer domain at the corner of the LSI. This results in a regular arrangement in the relation between the I/O buffer domain and the pad domain. Accordingly the pattern of the IC has a regular arrangement and CAD can be used effectively for the design of this IC.

2. Independence of the ground line (GND 1 in FIG. 5) from the I/O buffer. The ground line (GND 1) is provided separate from the ground line (GND 2) for unit-cells. Thus, the ground line (GND 1) is connected to the external power source independently. This prevents disturbance of the unit-cells by fluctuation of the power source voltage due to the operation of the I/O buffer, which usually operates at a high voltage, and ensures stable IC operation.

We claim:

1. An integrated circuit, manufactured by the master slice method, having an array of interconnected unit-cells having electrical elements, the array having a periphery and a middle portion and including interconnecting domains for interconnecting the unit-cells and interconnecting the electrical elements within each of the unit cells and for forming desired logic circuits by changing the interconnections of the electrical elements within each of the unit cells and changing the interconnections between each of the unit cells, the circuit comprising feeder lines, having first portions in the middle portion of the array and second portions, wider than the first portions, in the periphery of the array, operatively connected to the unit-cells, for supplying power to the unit-cells, said feeder lines extending from the periphery of the array toward the middle portion of the array and the first portions being substantially narrowed in width from the periphery of the array toward the middle portion of the array.

2. An integrated circuit as defined in claim 1, wherein said feeder lines are formed adjacent to the interconnecting domains and the first portions are gradually narrowed in width in the direction from the periphery toward the middle portion of the array by reduction of the width of at least one side of said feeder lines facing the interconnecting domains.

3. An integrated circuit as defined in claim 1, wherein the first portion of said feeder lines each have a central portion and wherein non-feeder portions are formed in the central portion and the width of said non-feeder portions gradually widen in a direction from the periphery of the array toward the middle portion of the array.

4. An integrated circuit manufactured by the master slice method and formed on a semiconductor chip having first through fourth sides and a middle portion, comprising:

an array of unit cells formed within the periphery of the first through fourth sides and extending to the middle portion of the semiconductor chip;

interconnecting domains having first and second sides for connecting said unit cell array to form logic circuits in dependence upon the interconnections between said unit cell array; and feeder lines having first and second sides and center portions operatively connected to said unit cell array, for supplying power to said unit cell array, said feeder lines extending from the periphery to the middle portion of said unit cell array and said center portions being substantially narrowed in width from the periphery to the middle portion of said unit cell array.

5. An integrated circuit as defined in claim 4, wherein said feeder lines are gradually narrowed in width in the direction along said feeder lines from the periphery to the middle portion of said unit cell array by reducing the width of said center portion of at least said first side of said feeder lines.

6. An integrated circuit as defined in claim 4, wherein said feeder lines each have non-feeder portions provided in said center portions of said feeder lines and substantially in the middle portion of said unit cell array, for forming two narrow feeder lines in the middle portion of said unit cell array.

* * * * *

UNITED STATES PATENT AND TRADEMARK OFFICE
CERTIFICATE OF CORRECTION

PATENT NO. : 4,499,484

DATED : FEBRUARY 12, 1985

INVENTOR(S) : TETSU TANIZAWA ET AL.

It is certified that error appears in the above-identified patent and that said Letters Patent is hereby corrected as shown below:

FRONT PAGE, after [22] insert the following:

--[30] Foreign Application Priority Data

Sept. 10, 1981 [JP] Japan ............ 56-142942--.

Signed and Sealed this

Seventh Day of May 1985

[SEAL]

Attest:

DONALD J. QUIGG

Attesting Officer

Acting Commissioner of Patents and Trademarks